United States Patent
Kawabe et al.

(10) Patent No.: US 10,367,109 B2
(45) Date of Patent: Jul. 30, 2019

(54) BACK SHEET OF SOLAR CELL MODULE, AND SOLAR CELL MODULE

(71) Applicant: DAIKIN INDUSTRIES, LTD., Osaka-Shi, Osaka (JP)

(72) Inventors: Takuma Kawabe, Osaka (JP); Kengo Ito, Osaka (JP); Eri Tanioka, Osaka (JP); Katsuhiko Imoto, Osaka (JP); Hideto Nakagawa, Osaka (JP); Kenji Gobou, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/562,457

(22) PCT Filed: Mar. 29, 2016

(86) PCT No.: PCT/JP2016/060155
§ 371 (c)(1),
(2) Date: Sep. 28, 2017

(87) PCT Pub. No.: WO2016/158963
PCT Pub. Date: Oct. 6, 2016

(65) Prior Publication Data
US 2018/0090632 A1    Mar. 29, 2018

(30) Foreign Application Priority Data

Mar. 31, 2015    (JP) .................................. 2015-073367

(51) Int. Cl.
*H01L 31/048*    (2014.01)
*H01L 31/049*    (2014.01)
(Continued)

(52) U.S. Cl.
CPC .......... *H01L 31/0481* (2013.01); *C08J 7/047* (2013.01); *C09D 7/40* (2018.01); *C09D 127/12* (2013.01);
(Continued)

(58) Field of Classification Search
CPC . H01L 31/0481; H01L 31/049; H01L 31/048; H01L 31/0216; C08J 7/047;
(Continued)

(56) References Cited

U.S. PATENT DOCUMENTS 9,920,214 B2 * 3/2018 Imahori ............... C09D 127/18
2011/0083726 A1    4/2011 Takayanagi et al.
(Continued)

FOREIGN PATENT DOCUMENTS

EP    1 938 967 A1    7/2008
EP    2 774 964 A1    9/2014
(Continued)

OTHER PUBLICATIONS

WO-2007010706-A1, Meiji et al.—english equivalent (machine translation) (Year: 2007).*
(Continued)

*Primary Examiner* — Susan D Leong
(74) *Attorney, Agent, or Firm* — Sughrue Mion, PLLC

(57) ABSTRACT

The invention provides a back sheet including a water-impermeable sheet and a film firmly bonded to each other and exhibiting excellent adhesiveness to an EVA encapsulant layer of a solar cell module even without corona discharge treatment on the film surface. The back sheet of the invention is a back sheet for solar cell module, including a water-impermeable sheet and a film. The film is disposed on at least one side of the water-impermeable sheet and is formed from a coating containing a fluorine-containing copolymer. The fluorine-containing copolymer contains a
(Continued)

C2-C3 perhaloolefin structural unit, a vinyl acetate structural unit, a hydroxy-containing vinyl monomer structural unit, and a carboxy-containing monomer structural unit.

10 Claims, 1 Drawing Sheet

(51) Int. Cl.
| | |
|---|---|
| *C09D 127/12* | (2006.01) |
| *C09D 131/04* | (2006.01) |
| *C09D 133/02* | (2006.01) |
| *C09D 133/14* | (2006.01) |
| *C09D 7/40* | (2018.01) |
| *C08J 7/04* | (2006.01) |
| *C09D 127/18* | (2006.01) |
| *C08F 214/26* | (2006.01) |
| *C08F 218/08* | (2006.01) |

(52) U.S. Cl.
CPC ......... *C09D 127/18* (2013.01); *C09D 131/04* (2013.01); *C09D 133/02* (2013.01); *C09D 133/14* (2013.01); *H01L 31/049* (2014.12); *C08F 214/265* (2013.01); *C08F 218/08* (2013.01); *C08J 2367/02* (2013.01); *C08J 2427/12* (2013.01); *C08J 2427/18* (2013.01); *C08J 2431/04* (2013.01)

(58) Field of Classification Search
CPC ............... C08J 2367/02; C08J 2427/12; C08J 2427/18; C08J 2431/04; C09D 127/12; C09D 127/18; C09D 131/04
See application file for complete search history.

(56) References Cited

U.S. PATENT DOCUMENTS

| | | |
|---|---|---|
| 2014/0018492 A1 | 1/2014 | Imahori et al. |
| 2014/0318617 A1 | 10/2014 | Nakagawa et al. |

FOREIGN PATENT DOCUMENTS

| | | | |
|---|---|---|---|
| JP | 07-176775 A | 7/1995 | |
| JP | 2004-214342 A | 7/2004 | |
| JP | 2013-136736 A | 7/2013 | |
| JP | 2013-177536 A | 9/2013 | |
| WO | 2007/010706 A1 | 1/2007 | |
| WO | WO-2007010706 A1 * | 1/2007 | ....... B32B 17/10018 |
| WO | 2009/157449 A1 | 12/2009 | |

OTHER PUBLICATIONS

International Preliminary Report on Patentability and Translation of Written Opinion dated Oct. 3, 2017 from the International Bureau in counterpart International application no. PCT/JP2016/060155.

International Search Report of PCT/JP2016/060155 dated Jun. 14, 2016.

Communication dated Sep. 5, 2018 from the European Patent Office in counterpart Application No. 16772844.3.

* cited by examiner

BACK SHEET OF SOLAR CELL MODULE, AND SOLAR CELL MODULE

CROSS REFERENCE TO RELATED APPLICATIONS

This application is a National Stage of International Application No. PCT/JP2016/060155 filed Mar. 29, 2016, claiming priority based on Japanese Patent Application No. 2015-073367 filed Mar. 31, 2015, the contents of all of which are incorporated herein by reference in their entirety.

TECHNICAL FIELD

The invention relates to back sheets for solar cell modules, and to solar cell modules.

BACKGROUND ART

Solar cell modules include a solar cell, an encapsulant layer that encapsulates the solar cell, a surface-protecting layer, and a back sheet. The encapsulant layer and the back sheet are preferably firmly bonded to each other. For back sheets including components such as a back-reinforcing material, a water-impermeable sheet, and a substrate sheet and a film, the components and the film need to be firmly bonded to each other. In order to achieve such bonding performance, some techniques are proposed.

Patent Literature 1 discloses a solar cell module including a solar cell embedded in a filler on a back-reinforcing material, wherein the surface of the back-reinforcing material in contact with the filler is coated with epoxy resin.

Patent Literature 2 discloses a solar cell substrate with excellent adhesiveness including a metal plate as a substrate and a film formed from a coating composition, wherein the coating composition contains a polyvinylidene fluoride-based fluororesin free from a functional group, and a tetraalkoxysilane or a partially hydrolyzed condensate of a tetraalkoxysilane in an amount of 0.5 to 100 parts by mass for each 100 parts by mass of the coating resin, and the partially hydrolyzed condensate of a tetraalkoxysilane is oriented to the film surface.

Patent Literature 3 discloses a back sheet for a solar cell module, including a water-impermeable sheet and, on at least one side of the water-impermeable sheet, a cured film formed from a fluorine-containing polymer coating containing a curable functional group.

Patent Literature 4 discloses a back sheet for a solar cell module, including a substrate sheet and, on one or both sides of the substrate sheet, a cured film layer formed from a coating containing a fluorine-containing polymer (A), wherein the polymer (A) contains a repeating unit based on a fluoroolefin (a), a repeating unit based on a crosslinkable group-containing monomer (b), and a repeating unit based on an alkyl-containing monomer (c) in which a C2-C20 linear or branched alkyl group free from a quaternary carbon atom and a polymerizable unsaturated group are linked via an ether bond or an ester bond.

CITATION LIST

Patent Literature

Patent Literature 1: JP H07-176775 A
Patent Literature 2: JP 2004-214342 A
Patent Literature 3: WO 2007/010706
Patent Literature 4: WO 2009/157449

SUMMARY OF INVENTION

Technical Problem

Patent Literature documents 2 to 4 propose back sheets including a film of a fluorine-containing polymer. Although these back sheets have excellent weather resistance, such fluorine-containing polymer films originally have poor adhesiveness to other materials. This leads to a demand for techniques capable of further improving the adhesiveness between a water-impermeable sheet and a film and the adhesiveness between a film and an encapsulant layer formed from an ethylene/vinyl acetate copolymer (EVA).

In consideration of the above state of the art, the invention aims to provide a back sheet including a water-impermeable sheet and a film firmly bonded to each other and exhibiting excellent adhesiveness to an EVA encapsulant layer of a solar cell module even without corona discharge treatment on the film surface.

Solution to Problem

The inventors found out that a film formed from a coating containing a fluorine-containing copolymer of a combination of specific monomers can firmly adhere to a water-impermeable sheet and an EVA encapsulant layer, thereby completing the invention.

In other words, the invention relates to a back sheet for a solar cell module, including:
a water-impermeable sheet; and
a film,
the film being disposed on at least one side of the water-impermeable sheet and being formed from a coating containing a fluorine-containing copolymer,
the fluorine-containing copolymer containing:
(a) a C2-C3 perhaloolefin structural unit;
(b) a vinyl acetate structural unit;
(c) a hydroxy-containing vinyl monomer structural unit represented by the formula (1):

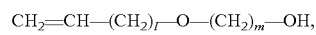
$$CH_2\!=\!CH\!-\!(CH_2)_l\!-\!O\!-\!(CH_2)_m\!-\!OH,$$

wherein l is 0 or 1, and m is an integer of 2 or greater; and
(d) a carboxy-containing monomer structural unit represented by the formula (2):

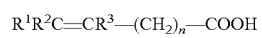
$$R^1R^2C\!=\!CR^3\!-\!(CH_2)_n\!-\!COOH$$

wherein $R^1$, $R^2$, and $R^3$ are the same as or different from each other, and are each a hydrogen atom or a C1-C10 linear or branched alkyl group, and n is an integer of 0 or greater.
In the formula (1), preferably, l is 0 and m is 2 or 4.
In the formula (2), n is preferably 0 to 20.
The fluorine-containing copolymer preferably contains:
15 to 50 mol % of the structural unit (a);
20 to 75 mol % of the structural unit (b);
5 to 22 mol % of the structural unit (c); and
0.1 to 5 mol % of the structural unit (d).
The fluorine-containing copolymer preferably further contains, as a monomer structural unit (e), a non-aromatic vinyl ester structural unit other than the vinyl acetate structural unit.
The fluorine-containing copolymer preferably has a number average molecular weight of 3,000 to 100,000.
The proportion of the structural unit (a) to the sum of the moles of the structural unit (a) and the structural unit (b) is preferably 0.16 to 0.51 in the fluorine-containing copolymer.
The coating preferably further contains an organic solvent.

The coating preferably further contains a curing agent.

The invention also relates to a solar cell module including a solar cell; an encapsulant layer that encapsulates the solar cell therein; and the above back sheet.

Advantageous Effects of Invention

Since the back sheet of the invention has the above configuration, the water-impermeable sheet and the film are firmly bonded to each other and the back sheet therefore has excellent durability. In addition, the back sheet exhibits excellent adhesiveness to an EVA encapsulant layer of a solar cell module. Thus, the back sheet can surely protect the solar cell module.

Since the solar cell module of the invention has the above configuration, it has high durability.

DESCRIPTION OF EMBODIMENTS

Figure 1:
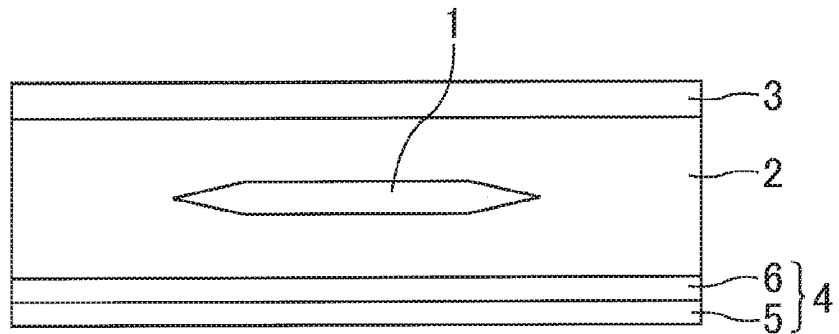
FIG. 1 is a schematic cross-sectional view of a first structure of a solar cell module.

The invention will specifically be described hereinbelow.

The back sheet for a solar cell module of the invention includes a water-impermeable sheet and a film.

The film is disposed on at least one side of the water-impermeable sheet. The film may be disposed on only one side of the water-impermeable sheet, or may be disposed on both sides thereof. The water-impermeable sheet and the film may be bonded either directly or with a different layer in between. Still, they are preferably bonded to each other directly. The different layer may be a primer layer, for example.

The primer layer is formed using a conventionally known coating for primers by a common method. Representative examples of the coating for primers include epoxy resin, urethane resin, acrylic resin, silicone resin, and polyester resin.

In order to achieve good opacity, weather resistance, chemical resistance, and moisture resistance, the film preferably has a thickness of 5 μm or greater. The thickness is more preferably 7 μm or greater, still more preferably 10 μm or greater. Too thick a film may fail to give an effect of weight reduction. Thus, the upper limit of the thickness is preferably about 1,000 μm, more preferably about 100 μm. The thickness is particularly preferably 10 to 40 μm.

The film is formed from a coating. The film can be formed by applying the coating to the water-impermeable sheet or the different layer, optionally followed by drying and curing of the coating.

The drying and curing can be performed at 10° C. to 300° C., usually 100° C. to 200° C., for 30 seconds to 3 days. The dried and cured coat may be aged. The aging is usually performed at 20° C. to 300° C. and completed within 1 minute to 3 days.

The coating contains a fluorine-containing copolymer. The fluorine-containing copolymer contains:
(a) a C2-C3 perhaloolefin structural unit;
(b) a vinyl acetate structural unit;
(c) a hydroxy-containing vinyl monomer structural unit represented by the formula (1):

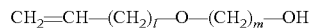

(wherein l is 0 or 1; and m is an integer of 2 or greater); and
(d) a carboxy-containing monomer structural unit represented by the formula (2):

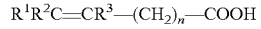

(wherein $R^1$, $R^2$, and $R^3$ are the same as or different from each other, and are each a hydrogen atom or a C1-C10 linear or branched alkyl group; and n is an integer of 0 or greater).

In the present description, each monomer component and the corresponding monomer structural unit share the same reference symbol.

The C2-C3 perhaloolefin (a) is preferably tetrafluoroethylene (TFE), chlorotrifluoroethylene (CTFE), or hexafluoropropylene (HFP).

In the hydroxy-containing vinyl monomer (c) represented by the formula (1):

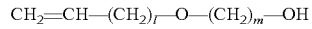

(wherein l is 0 or 1; and m is an integer of 2 or greater), m is preferably 10 or smaller. In particular, the monomer (c) is preferably hydroxyethyl vinyl ether (HEVE) or hydroxybutyl vinyl ether (HBVE) wherein l is 0 and m is 2 or 4. The monomer (c) is also preferably 2-hydroxyethyl allyl ether or 4-hydroxybutyl allyl ether wherein l is 1 and m is 2 or 4.

In the formula (2), n is more preferably an integer of 0 to 20, still more preferably an integer of 0 to 10.

Examples of the carboxy-containing monomer (d) include acrylic acid, methacrylic acid, vinylacetic acid, crotonic acid, pentenoic acid, hexenoic acid, heptenoic acid, octenoic acid, nonenoic acid, decenoic acid, undecylenic acid, dodecenoic acid, tridecenoic acid, tetradecenoic acid, pentadecenoic acid, hexadecenoic acid, heptadecenoic acid, octadecenoic acid, nonadecenoic acid, eicosenoic acid, and 22-tricosenoic acid. Preferred is acrylic acid.

The fluorine-containing copolymer may further contain a monomer structural unit (e) in addition to the structural units (a) to (d). Examples of the monomer (e) include the following monomers, and non-aromatic vinyl esters (other than vinyl acetate) are preferred.

(e1) Non-Aromatic Vinyl Esters Other than the Vinyl Acetate (b)

Examples thereof include vinyl propionate, vinyl butyrate, vinyl isobutyrate, vinyl pivalate, vinyl caproate, vinyl versatate, vinyl laurate, vinyl stearate, and vinyl cyclohexylcarboxylate, one of which or two or more of which may be used. These monomers are non-aromatic monomers containing neither a hydroxy group nor a carboxy group, and have an effect of improving the compatibility between the copolymer and other components of the coating, such as acrylic resin, a curing agent, and a dispersant. Particularly preferred non-aromatic vinyl ester monomers are vinyl versatate, vinyl laurate, vinyl stearate, and vinyl cyclohexylcarboxylate because they have excellent weather resistance, compatibility, and inexpensiveness. In terms of chemical resistance, preferred are vinyl carboxylates in which the carboxylic acid has a carbon number of 6 or greater, more preferred are vinyl carboxylates in which the carboxylic acid has a carbon number of 9 or greater. The upper limit of the carbon number of the carboxylic acid in each vinyl carboxylate is preferably 20, more preferably 15. In order to achieve excellent adhesiveness to the encapsulant layer, vinyl versatate is most preferred.

(e2) Hydroxy-Containing Vinyl Monomers Other than the Hydroxy-Containing Vinyl Monomer (c) of the Formula (1)

Examples thereof include 2-hydroxy-2-methylpropyl vinyl ether, 4-hydroxy-2-methylbutyl vinyl ether, and glycerol monoallyl ether, one of which or two or more of which may be used.

(e3) Carboxy-Containing Monomers or Anhydrides Thereof Other than the Carboxy-Containing Monomer (d) of the Formula (2)

Examples thereof include cinnamic acid, 3-allyloxypropionic acid, itaconic acid, monoitaconates, maleic acid, monomaleates, maleic anhydrides, fumaric acid, monofumarates, vinyl phthalate, vinyl pyromellitate, citraconic acid, mesaconic acid, and aconitic acid, one of which or two or more of which may be used.

(e4) Aromatic Group-Containing Monomers

The aromatic group-containing monomers are monomers containing an aromatic group and containing neither a hydroxy group nor a carboxy group. Examples thereof include vinyl benzoate monomers, such as vinyl benzoate and vinyl para-tert-butyl benzoate, one of which or two or more of which may be used. Preferred is vinyl para-tert-butyl benzoate or vinyl benzoate, more preferred is vinyl benzoate.

(e5) Other Copolymerizable Monomers

Examples thereof include alkyl vinyl ethers such as methyl vinyl ether and ethyl vinyl ether; and fluorine-free olefins such as ethylene, propylene, n-butene, and isobutene.

The fluorine-containing copolymer preferably has a number average molecular weight of 3,000 to 100,000. The number average molecular weight is more preferably 5,000 or higher, still more preferably 8,000 or higher, while more preferably 50,000 or lower, still more preferably 35,000 or lower. Too low a number average molecular weight may cause a failure in providing a film having excellent weather resistance, solvent resistance, and stain resistance as well as high hardness. Too high a number average molecular weight may cause a highly viscous coating which is difficult to handle. The number average molecular weight can be measured by gel permeation chromatography (GPC) with tetrahydrofuran used as an eluent.

The fluorine-containing copolymer preferably has a glass transition temperature (second run) of 10° C. to 70° C., more preferably 15° C. to 60° C., measured using a differential scanning calorimeter (DSC). Too low a glass transition temperature may cause poor weather resistance, solvent resistance, and stain resistance and may cause a failure in providing a film having high hardness. Too high a glass transition temperature may cause a highly viscous coating which is difficult to handle.

In order to achieve good compatibility with a curing agent, the fluorine-containing copolymer preferably has an acid value of 0.6 to 28.8 mgKOH/g, more preferably 2 to 12 mgKOH/g.

In order to form a film having excellent weather resistance, solvent resistance, and stain resistance, as well as high hardness, the fluorine-containing copolymer preferably has a hydroxyl value of 29 to 120 mgKOH/g. The hydroxyl value of the fluorine-containing copolymer is more preferably 100 mgKOH/g or lower.

The fluorine-containing copolymer preferably has a fluorine content of 12 mass % or more.

The fluorine-containing copolymer preferably contains:
15 to 50 mol % of the structural unit (a);
20 to 75 mol % of the structural unit (b);
5 to 22 mol % of the structural unit (c); and
0.1 to 5 mol % of the structural unit (d).

The proportion of the structural unit (c) may preferably be 23 to 75 mol %.

The fluorine-containing copolymer may also preferably contain:
15 to 50 mol % of the structural unit (a);
20 to 75 mol % of the structural unit (b);
5 to 22 mol % of the structural unit (c);
0.1 to 5 mol % of the structural unit (d); and
0 to 25 mol % of the structural unit (e).

The fluorine-containing copolymer preferably satisfies that the proportion of the structural unit (a) to the sum of the moles of the structural unit (a) and the structural unit (b) is 0.16 to 0.51 in the fluorine-containing copolymer. The proportion of the structural unit (a) to the sum of the moles of the structural unit (a) and the structural unit (b) is more preferably 0.22 or more, while more preferably 0.50 or less, still more preferably 0.46 or less, particularly preferably 0.45 or less. The fluorine-containing copolymer satisfying the proportion of the structural unit (a) to the sum of the moles of the structural unit (a) and the structural unit (b) within the above range can provide a film having excellent weather resistance, solvent resistance, and stain resistance, as well as high hardness. Thus, the resulting back sheet can surely protect the solar cell module. Too large a ratio of the structural unit (a) to the structural unit (b) may cause a failure in providing a film having sufficiently high hardness. Too small a ratio of the structural unit (a) to the structural unit (b) may cause a failure in providing a film having excellent weather resistance, solvent resistance, and stain resistance.

The proportion of the structural unit (a) to the sum of the moles of the structural unit (a) and the structural unit (b) can be calculated from the fluorine content (mass %) determined by elemental analysis and the compositional analysis by $^1$H-NMR spectrum.

The fluorine-containing copolymer preferably contains 15 to less than 40 mol % of the structural unit (a) relative to all the structural units constituting the fluorine-containing copolymer. The amount of the structural unit (a) is more preferably 20 mol % or more, while more preferably 39 mol % or less. The fluorine-containing copolymer containing the structural unit (a) in an amount within the above range enables formation of a film having much better weather resistance, solvent resistance, and stain resistance, as well as much higher hardness.

The fluorine-containing copolymer preferably contains 38 to less than 75 mol % of the structural unit (b) relative to all the structural units constituting the fluorine-containing copolymer. The amount of the structural unit (b) is more preferably 49.4 mol % or more, still more preferably 50.4 mol % or more, while more preferably 74.7 mol % or less, still more preferably 69.7 mol % or less. The fluorine-containing copolymer containing the structural unit (b) in an amount within the above range enables formation of a film having much better weather resistance, solvent resistance, and stain resistance, as well as much higher hardness.

The fluorine-containing copolymer preferably contains 53 to less than 95 mol % in total of the structural unit (a) and the structural unit (b) relative to all the structural units constituting the fluorine-containing copolymer. The amount of the structural unit (a) and the structural unit (b) is more preferably 77.5 mol % or more, still more preferably 81.9 mol % or more, while more preferably 94.8 mol % or less, still more preferably 91.2 mol % or less. The fluorine-containing copolymer containing the structural unit (a) and the structural unit (b) in an amount within the above range enables formation of a film having much better weather resistance, solvent resistance, and stain resistance, as well as much higher hardness.

In order to provide a film having much better weather resistance, solvent resistance, and stain resistance, as well as much higher hardness, the fluorine-containing copolymer preferably contains:

15 to less than 40 mol % of the structural unit (a);
38 to less than 75 mol % of the structural unit (b);
5 to 22 mol % of the structural unit (c); and
0.1 to 5 mol % of the structural unit (d).

In order to provide a film having much better weather resistance, solvent resistance, and stain resistance, as well as much higher hardness, the fluorine-containing copolymer more preferably contains:

20 to 39 mol % of the structural unit (a);
42 to 69.7 mol % of the structural unit (b);
5 to 18.5 mol % of the structural unit (c); and
0.1 to 5 mol % of the structural unit (d).

In order to provide a film having much better weather resistance, solvent resistance, and stain resistance, as well as much higher hardness, the fluorine-containing copolymer still more preferably contains:

25 to 39 mol % of the structural unit (a);
42 to 64.7 mol % of the structural unit (b);
5 to 18.5 mol % of the structural unit (c); and
0.1 to 5 mol % of the structural unit (d).

The fluorine-containing copolymer particularly preferably satisfies that the proportion of the structural unit (a) to the sum of the moles of the structural unit (a) and the structural unit (b) is within the above range and the proportions of the structural units (a) to (d) are within the above respective ranges.

The fluorine-containing copolymer may further contain the monomer structural unit (e) in addition to the structural units (a) to (d). The monomer (e) may be any monomer that is copolymerizable with the monomers (a) to (d) and that does not impair the effects of the invention. The amount of the structural unit (e) is preferably 0 mol % or 25 mol % or less, more preferably 0.1 mol % or more, relative to all the structural units constituting the fluorine-containing copolymers.

The fluorine-containing copolymer can be produced by solution polymerization, emulsion polymerization, suspension polymerization, or bulk polymerization, and is preferably produced by solution polymerization.

The fluorine-containing copolymer is preferably produced by polymerizing monomers giving the above structural units through solution polymerization using an organic solvent and a polymerization initiator. The polymerization temperature is usually 0° C. to 150° C., preferably 5° C. to 95° C. The polymerization pressure is usually 0.1 to 10 MPaG (1 to 100 kgf/cm²G).

Examples of the organic solvent include esters such as methyl acetate, ethyl acetate, propyl acetate, n-butyl acetate, and tert-butyl acetate; ketones such as acetone, methyl ethyl ketone, and cyclohexanone; aliphatic hydrocarbons such as hexane, cyclohexane, octane, nonane, decane, undecane, dodecane, and mineral spirits; aromatic hydrocarbons such as benzene, toluene, xylene, naphthalene, and solvent naphtha; alcohols such as methanol, ethanol, tert-butanol, isopropanol, and ethylene glycol monoalkyl ethers; cyclic ethers such as tetrahydrofuran, tetrahydropyran, and dioxane; and dimethyl sulfoxide, and mixtures thereof.

Examples of the polymerization initiator include persulfates such as ammonium persulfate and potassium persulfate (optionally in combination with any of reducing agents such as sodium hydrogen sulfite, sodium pyrosulfite, cobalt naphthenate, and dimethyl aniline); redox initiators each of which is a combination of an oxidizing agent (e.g., ammonium peroxide or potassium peroxide), a reducing agent (e.g., sodium sulfite), and a transition metal salt (e.g., iron sulfate); diacyl peroxides such as acetyl peroxide and benzoyl peroxide; dialkoxycarbonyl peroxides such as isopropoxycarbonyl peroxide and tert-butoxycarbonyl peroxide; ketone peroxides such as methyl ethyl ketone peroxide and cyclohexanone peroxide; hydroperoxides such as hydrogen peroxide, tert-butyl hydroperoxide, and cumene hydroperoxide; dialkyl peroxides such as di-tert-butyl peroxide and dicumyl peroxide; alkyl peroxy esters such as tert-butyl peroxyacetate and tert-butyl peroxypivalate; and azo compounds such as 2,2'-azobisisobutyronitrile, 2,2'-azobis(2,4-dimethylvaleronitrile), 2,2'-azobis(2-methylvaleronitrile), 2,2'-azobis(2-cyclopropylpropionitrile), 2,2'-azobis-dimethyl isobutyrate, 2,2'-azobis[2-(hydroxymethyl)propionitrile], and 4,4'-azobis(4-cyanopentenoic acid).

The coating preferably contains an organic solvent.

Examples of the organic solvent include esters such as ethyl acetate, n-butyl acetate, tert-butyl acetate, isopropyl acetate, isobutyl acetate, cellosolve acetate, and propylene glycol methyl ether acetate; ketones such as acetone, methyl ethyl ketone, methyl isobutyl ketone, and cyclohexanone; cyclic ethers such as tetrahydrofuran and dioxane; amides such as N,N-dimethyl formamide and N,N-dimethyl acetamide; aromatic hydrocarbons such as toluene and xylene; alcohols such as propylene glycol methyl ether; hydrocarbons such as hexane and heptane; and solvent mixtures thereof. Examples thereof also include the third-class organic solvents mentioned in the Industrial Safety and Health Act and solvents equivalent thereto, which are called weak solvents. In the case of preparing a solution of the fluorine-containing copolymer in an organic solvent, the concentration of the fluorine-containing copolymer has only to be 5 to 95 mass %, preferably 10 to 80 mass %.

The coating preferably further contains a curing agent. The curing agent is a compound crosslinkable by a reaction with a cure-reactive group of the fluorine-containing copolymer, and common examples thereof include isocyanates, amino resins, acid anhydrides, polyepoxy compounds, and isocyanate-containing silane compounds. Preferred are isocyanates.

Specific examples of the isocyanates include, but are not limited to, 2,4-tolylene diisocyanate, diphenylmethane-4,4'-diisocyanate, xylylene diisocyanate, isophorone diisocyanate, lysine methyl ester diisocyanate, methyl cyclohexyl diisocyanate, trimethyl hexamethylene diisocyanate, hexamethylene diisocyanate, n-pentane-1,4-diisocyanate, trimers thereof, adduct products, biuret products, or isocyanurate products thereof, polymers thereof containing two or more isocyanate groups, and block isocyanates. Preferred are isocyanurate products.

Specific examples of the amino resins include, but are not limited to, urea resin, melamine resin, benzoguanamine resin, glycoluril resin, as well as methylolated melamine resin produced by methylolating melamine, and alkyl etherified melamine resin produced by etherifying methylolated melamine with an alcohol such as methanol, ethanol, or butanol.

Specific examples of the acid anhydrides include, but are not limited to, phthalic anhydride, pyromellitic anhydride, and mellitic anhydride.

Examples of the polyepoxy compounds and the isocyanate-containing silane compounds to be used include those disclosed in JP H02-232250 A and JP H02-232251 A. For preferred examples, those represented by the following formulas:

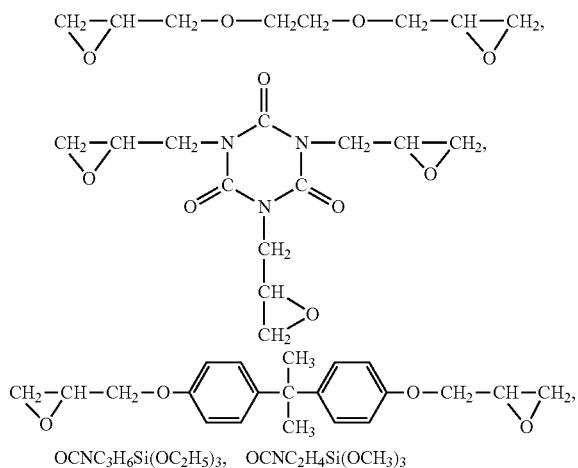

may be mentioned.

The amount of the curing agent is 0.1 to 5 equivalents, preferably 0.5 to 1.5 equivalents, relative to 1 equivalent of the chemically cure-reactive group in the fluorine-containing copolymer. The coating can usually be cured at 0° C. to 200° C. within several minutes to about 10 days. Examples of the chemically cure-reactive group include a hydroxy group and a carboxy group.

The coating preferably further contains a second resin other than the fluorine-containing copolymer. Examples of the second resin include organic resin such as polystyrene, (meth)acrylic resin, polyester resin, alkyd resin, melamine-formaldehyde resin, polyisocyanate resin, epoxy resin, vinyl chloride resin (e.g., vinyl chloride-vinyl acetate copolymers), ketone resin, and petroleum resin, as well as chlorinated products of polyolefins such as polyethylene and polypropylene; inorganic resin such as silica gel and silicic acid; and various fluororesins other than the fluorine-containing copolymer (e.g., homopolymers of tetrafluoroethylene and of chlorotrifluoroethylene, and copolymers thereof with another monomer). The proportion of the second resin is 900 parts by mass or less, preferably 500 parts by mass or less, relative to 100 parts by mass of the fluorine-containing copolymer. The lower limit thereof is an amount required to achieve the target properties, and depends on the type of the resin. For (meth)acrylic resin, the lower limit is usually 5 parts by mass or more, preferably 1.0 parts by mass or more.

The coating preferably contains a (meth)acrylic resin especially having excellent compatibility among these resins, which leads to a film having good gloss, high hardness, and good finish appearance.

Examples of the (meth)acrylic resin include (meth)acrylic polymers conventionally used for coatings. Particularly preferred are (i) homopolymers or copolymers of a C1-C10 alkyl ester of (meth)acrylic acid and (ii) (meth)acrylic acid ester copolymers having a curable functional group in a side chain and/or at an end of the main chain.

Examples of the (meth)acrylic polymers (i) include homopolymers and copolymers of a C1-C10 alkyl ester of (meth)acrylic acid such as n-butyl (meth)acrylate, isobutyl (meth)acrylate, and 2-ethylhexyl (meth)acrylate, and copolymers thereof with an ethylenic unsaturated monomer copolymerizable therewith.

Examples of the copolymerizable ethylenic unsaturated monomer include aromatic vinyl monomers such as aromatic group-containing (meth)acrylates, (meth)acrylates having a fluorine atom or a chlorine atom at the a position, fluoroalkyl (meth)acrylates in which an alkyl group is replaced by a fluorine atom, vinyl ethers, vinyl esters, and styrene, olefins such as ethylene, propylene, isobutylene, vinyl chloride, and vinylidene chloride, fumaric acid diesters, maleic acid diesters, and (meth)acrylonitrile.

Examples of the (meth)acrylic polymers (ii) include copolymers of a monomer that gives the (meth)acrylic polymer (i) described above and a monomer having a curable functional group. Examples of the curable functional group-containing monomer include monomers having any of a hydroxy group, a carboxy group, an epoxy group, and an amino group. Specific examples of the (meth)acrylic polymers (ii) include, but are not limited to, copolymers of a monomer having a curable functional group such as hydroxyethyl (meth)acrylate, 2-hydroxypropyl (meth)acrylate, 2-hydroxyethyl vinyl ether, (meth)acrylic acid, glycidyl (meth)acrylate, 2-aminoethyl (meth)acrylate, or 2-aminopropyl (meth)acrylate and the C1-C10 alkyl ester of (meth) acrylic acid and copolymers of any of these monomers and the copolymerizable ethylenic unsaturated monomer.

The (meth)acrylic polymer preferably has a number average molecular weight determined by GPC of 1,000 to 200,000, more preferably 2,000 to 100,000. The higher the number average molecular weight is, the lower the solvent solubility tends to be. The lower the number average molecular weight is, the more inappropriate the weather resistance tends to be.

The coating may further contain an additive. Examples of the additive include a curing accelerator, a pigment, a dispersant, a fluidity improver, a leveling agent, an antifoam, an anti-gelling agent, an ultraviolet absorber, an antioxidant, a hydrophilic agent, a flatting agent, an adhesiveness promoter, and a flame retardant.

Examples of the pigment include titanium dioxide. The titanium dioxide may be in any form, either rutile or anatase. In order to achieve good weather resistance, the rutile form is preferred. The titanium dioxide may be in the form of fine particles having a surface subjected to inorganic treatment or organic treatment, or to both inorganic and organic treatments. Examples of the inorganically treated titanium dioxide include titanium dioxide fine particles having a surface coated with alumina ($Al_2O_3$), silica ($SiO_2$), or zirconia ($ZrO_2$). Examples of the organically treated titanium dioxide include those subjected to surface treatment with a silane-coupling agent, those subjected to surface treatment with an organosiloxane, those subjected to surface treatment with an organic polyol, and those subjected to surface treatment with an alkyl amine. The titanium dioxide preferably has a basic value higher than the acid value thereof determined by titration.

Examples of commercially available products of the titanium dioxide include D-918 (Sakai Chemical Industry Co., Ltd.), R-960, R-706, and R-931 (DuPont), and PFC-105 (Ishihara Sangyo Kaisha, Ltd.).

The amount of the titanium dioxide is preferably 1 to 500 parts by mass relative to 100 parts by mass of the fluorine-containing copolymer. Less than 1 part by mass of the titanium dioxide may fail to block ultraviolet rays. More than 500 parts by mass thereof may suffer yellowing and deterioration due to ultraviolet rays. The amount of the titanium dioxide is more preferably 5 parts by mass or more, still more preferably 10 parts by mass or more, while more preferably 300 parts by mass or less, still more preferably 200 parts by mass or less.

The pigment may also be carbon black. The carbon black may be any one, such as any of those commonly known. In order to achieve an effect of blocking ultraviolet rays, the carbon black preferably has an average particle size of 10 to 150 nm, more preferably 20 to 100 nm. The average particle size is a value determined by electron microscopic observation.

The carbon black may agglomerate in the composition. In order to achieve an effect of blocking ultraviolet rays, the average particle size thereof in this case is preferably 50 to 1,000 nm, more preferably 100 to 700 nm, still more preferably 100 to 500 nm. The average particle size is a value determined using a laser diffraction scattering particle size distribution analyzer.

The amount of the carbon black is preferably 0.5 to 80 parts by mass relative to 100 parts by mass of the fluorine-containing copolymer. The carbon black in an amount within the above range can well disperse in the coating. The amount of the carbon black is more preferably 3 parts by mass or more, still more preferably 10 parts by mass or more, while more preferably 60 parts by mass or less, still more preferably 50 parts by mass or less, relative to 100 parts by mass of the fluorine-containing copolymer.

Examples of commercially available products of the carbon black include MA-100 (Mitsubishi Chemical Corp.) and Raven-420 (Columbian Carbon Co.).

The coating containing the pigment preferably further contains a dispersant or fluidity improver mentioned below.

Examples of the dispersant include a compound having an acid radical (other than those having an unsaturated group). Examples of the acid radical include a phosphate group, a carboxylate group, and a sulfonate group. In order to prevent agglomeration of the pigment for a long time and to achieve excellent storage stability of the coating, the acid radical is preferably at least one selected from the group consisting of a phosphate group and a carboxylate group, more preferably a phosphate group. The dispersant also contains a compound free from an unsaturated group. Since the compound is free from an unsaturated group, it is less likely to be degenerated by exposure to ultraviolet rays.

The dispersant preferably has a weight average molecular weight of 300 to 1,000,000. The dispersant having a weight average molecular weight of less than 300 may have an adsorbed resin layer with insufficient steric stabilization, failing to prevent agglomeration of the titanium dioxide. The dispersant having a weight average molecular weight exceeding 1,000,000 may cause mottle and reduced weather resistance. The weight average molecular weight is more preferably 1,000 or more and 100,000 or less. The weight average molecular weight can be determined by gel permeation chromatography (GPC) (polystyrene equivalent).

In order to achieve effective adsorption to the titanium dioxide surface, the dispersant preferably has an acid value of 3 to 2,000 mgKOH/g. The acid value is more preferably 5 mgKOH/g or higher, still more preferably 10 mgKOH/g or higher, while more preferably 1,000 mgKOH/g or lower, still more preferably 500 mgKOH/g or lower. The acid value can be determined by acid-base titration using a basic substance.

The dispersant may further contain a base. The base may be an amino group, for example.

In order to achieve good long-term storage stability of the dispersant, the dispersant preferably has a basic value of 15 mgKOH/g or lower, more preferably 5 mgKOH/g or lower.

The dispersant having an acid value of 15 mgKOH/g or lower still more preferably has a basic value of lower than 5 mgKOH/g.

The dispersant is still more preferably substantially free from a base. The phrase "substantially free from a base" herein means that the measured basic value is 0.5 mgKOH/g or lower in consideration of contamination, reaction residues, measurement errors, and other relating factors. The basic value can be determined by acid-base titration using an acidic substance.

The dispersant may be any of commercially available products. Examples thereof include DISPARLON 2150, DISPARLON DA-325, DA-375, and DA-1200 (trade name, Kusumoto Chemicals, Ltd.), FLOWLEN G-700 and G-900 (trade name, Kyoeisha Chemical Co., Ltd.), SOLSPERSE 26000, 32000, 36000, 36600, 41000, and 55000 (trade name, Lubrizol Japan Ltd.), and DISPERBYK-102, 106, 110, 111, 140, 142, 145, 170, 171, 174, and 180 (trade name, BYK Japan KK). In order to achieve good long-term storage stability, preferred are DISPARLON DA-375, FLOWLEN G-700, and SOLSPERSE 36000, and more preferred is DISPARLON DA-375.

The dispersant is preferably used in combination with the titanium dioxide. The amount of the dispersant is preferably 0.1 to 100 parts by mass relative to 100 parts by mass of the titanium dioxide. Less than 0.1 parts by mass of the dispersant may fail to achieve an effect of preventing precipitation of the pigment. More than 100 parts by mass thereof tends to cause mottle and reduced weather resistance. The amount of the dispersant is more preferably 0.5 parts by mass or more, still more preferably 1.5 parts by mass or more, while more preferably 50 parts by mass or less, still more preferably 20 parts by mass or less.

The fluidity improver may be an associative acrylic polymer having an acid radical and a base. The associative acrylic polymer herein means a polymer in which polar groups contained in the acrylic polymer chains form a structure by, for example, partial adsorption due to hydrogen bonds or electric interactions in the polymer chains or between the polymer chains to achieve an effect of increasing the viscosity of the liquid.

Examples of the acrylic polymer include copolymers containing, as a main monomer, a (meth)acrylate such as methyl (meth)acrylate, ethyl (meth)acrylate, n-butyl (meth) acrylate, isobutyl (meth)acrylate, t-butyl (meth)acrylate, n-octyl (meth)acrylate, isooctyl (meth)acrylate, 2-ethylhexyl (meth)acrylate, isononyl (meth)acrylate, and cyclohexyl (meth)acrylate. The term "(meth)acrylate" herein includes both acrylate and methacrylate.

The acid radical is preferably a carboxylate group, a phosphate group, or a sulfonate group. In order to prevent agglomeration of the pigment for a long time and to maintain the storage stability of the coating, a carboxylate group is particularly preferred. The base may be an amino group.

The fluidity improver may be a reaction product between a carboxylic acid and a nitrogen-containing compound such as a hydroxylamine or hydroxyimine. The ratio between the carboxylic acid and the nitrogen-containing compound to be reacted is most preferably 1:1. Examples of the carboxylic acid include dicarboxylic acids and acid anhydrides. Examples of the hydroxylamine include primary, secondary, or tertiary alkanol amines such as monoethanol amine, propanol amine, diethanol amine, triethanol amine, and n-butyl diethanol amine, and mixtures thereof. Examples of the hydroxyimine include those having an oxazoline structure such as, specifically, Alkaterge T (trade name, Angus Chemical Co.).

The fluidity improver preferably has a weight average molecular weight of 1,000 to 1,000,000. The fluidity improver having a weight average molecular weight of less than 1,000 may insufficiently form an associative structure and fail to prevent precipitation of the titanium dioxide. The fluidity improver having a weight average molecular weight exceeding 1,000,000 may cause an excessive increase in the viscosity of the liquid, impairing the coating easiness. The weight average molecular weight is more preferably 5,000 or more and 100,000 or less. The weight average molecular weight can be determined by gel permeation chromatography (GPC) (polystyrene equivalent).

The fluidity improver may be a commercially available product. An example thereof is SOLTHIX 250 (trade name, Lubrizol Japan Ltd.).

The amount of the fluidity improver is preferably 0.05 to 20 mass % in the coating. Less than 0.05 mass % of the fluidity improver may fail to prevent precipitation of the titanium dioxide. More than 20 mass % thereof may cause separation or mottle. The amount of the fluidity improver is more preferably 0.1 mass % or more, still more preferably 0.3 mass % or more, while more preferably 10 mass % or less, still more preferably 5 mass % or less.

The flame retardant is preferably an agent generating incombustible gas in an early stage of combustion to dilute combustible gas and/or to block oxygen, thereby achieving the incombustibility.

The flame retardant is preferably at least one selected from the group consisting of compounds containing an element from Group 5B of the Periodic Table and compounds containing a halogen compound from Group 7B of the Periodic Table.

Examples of the compounds containing a halogen compound from Group 7B of the Periodic Table include aliphatic, alicyclic, or aromatic organohalogen compounds, such as bromine-based compounds, including tetrabromobisphenol A (TBA), decabromodiphenyl ether (DBDPE), octabromodiphenyl ether (OBDPE), TBA epoxy/phenoxy oligomers, and brominated crosslinked polystyrene, and chlorine-based compounds, including chlorinated paraffin and perchlorocyclopentadecane.

Examples of the compounds containing an element from Group 5B of the Periodic Table include phosphorus compounds such as phosphoric acid esters and polyphosphoric acid salts. Also preferred are antimony compounds used in combination with a halogen compound, such as antimony trioxide and antimony pentoxide. Aluminum hydroxide, magnesium hydroxide, and molybdenum trioxide may also be used.

At least one of these flame retardants may be selected and used in any amount in accordance with the type of the fluorine-containing copolymer, and the flame retardant is not limited thereto.

The flame retardant is specifically more preferably a phosphorus- and nitrogen-containing composition (A) or a mixture (B) of a bromine-containing compound and an antimony-containing compound. Combination of the fluorine-containing copolymer with such a flame retardant leads to high incombustibility.

The phosphorus- and nitrogen-containing composition (A) is preferably a mixture of a piperazine pyrophosphate and melamine cyanurate. Examples of the piperazine pyrophosphate include those disclosed in JP S48-088791 A and in U.S. Pat. No. 4,599,375 B. One example of the melamine cyanurate is powder of a reaction product of melamine and cyanuric acid. The reaction product of melamine and cyanuric acid has many nitrogen atoms in the structure, and generates nitrogen gas when exposed to a high temperature of about 350° C. or higher, exhibiting an action of inhibiting combustion.

The phosphorus- and nitrogen-containing composition (A) preferably satisfies that the mass ratio of the melamine cyanurate to the piperazine pyrophosphate is 0.014 to 3.000. The melamine cyanurate in a ratio within the above range can improve the incombustibility and leads to good blocking performance of the film. The mass ratio of the melamine cyanurate to the piperazine pyrophosphate is more preferably 0.04 or higher, still more preferably 0.1 or higher, while more preferably 1.4 or lower, still more preferably 0.5 or lower, in the mixture.

Examples of commercially available products to be used as the phosphorus- and nitrogen-containing composition (A) include SCFR-200 (Sakai Chemical Industry Co., Ltd.) and SCFR-110 (Sakai Chemical Industry Co., Ltd.).

The bromine-containing compound is preferably an aromatic compound having a bromine content of 65% or higher, a melting point of 200° C. or higher, and a 5% decomposition temperature of 340° C. or higher.

Specifically, the bromine-containing compound is preferably at least one selected from the group consisting of decabromodiphenyl oxide, 1,2-bis(2,3,4,5,6-pentabromophenyl)ethane, tris(tribromophenoxy)triazine, ethylene bistetrabromophthalimide, polybromophenylindan, brominated phenylene oxide, and polypentabromobenzyl acrylate.

In particular, 1,2-bis(2,3,4,5,6-pentabromophenyl)ethane represented by the following formula (a) is more preferred because it has a high melting point and does not melt or bleed out even when the film is heat-cured.

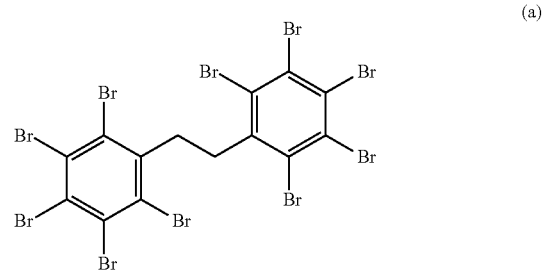 [SMILES: Brc1c(Br)c(Br)c(CCc2c(Br)c(Br)c(Br)c(Br)c2Br)c(Br)c1Br]

(a)

The bromine-containing compound may be a commercially available product, such as SAYTEX 8010 (Albemarle Corp.).

Examples of the antimony-containing compound include antimony oxides such as antimony trioxide and antimony pentoxide. In terms of acquisition at a low price, antimony trioxide is preferred.

The amount of the flame retardant is preferably 1 to 45 parts by mass relative to 100 parts by mass of the fluorine-containing copolymer. The flame retardant in an amount within the above range is expected to have good dispersibility in the composition and to improve the incombustibility of a film obtainable from the composition. Less than 1 part by mass of the flame retardant may fail to improve the incombustibility. More than 45 parts by mass thereof may have difficulty in maintaining the physical properties of the composition and the film. The amount of the flame retardant is more preferably 30 parts by mass or less, still more preferably 20 parts by mass or less, particularly preferably 15 parts by mass or less, relative to 100 parts by mass of the fluorine-containing copolymer. The amount thereof is more preferably 3 parts by mass or more, still more preferably 5 parts by mass or more.

For the flame retardant which is the phosphorus- and nitrogen-containing composition (A), the amount thereof is preferably 8 to 19 parts by mass relative to 100 parts by mass of the fluorine-containing copolymer. The amount of the phosphorus- and nitrogen-containing composition (A) is more preferably 9 parts by mass or more, still more preferably 10 parts by mass or more, while more preferably 17 parts by mass or less, still more preferably 15 parts by mass or less, relative to 100 parts by mass of the fluorine-containing copolymer.

For the flame retardant which is the mixture (B) of a bromine-containing compound and an antimony-containing compound, the amount of the bromine-containing compound is preferably 1 to 30 parts by mass and the amount of the antimony-containing compound is preferably 0.5 to 15 parts by mass each relative to 100 parts by mass of the fluorine-containing copolymer. The amount of the bromine-containing compound is more preferably 3 parts by mass or more, still more preferably 5 parts by mass or more, while more preferably 20 parts by mass or less, still more preferably 15 parts by mass or less, relative to 100 parts by mass of the fluorine-containing copolymer. The amount of the antimony compound is more preferably 1.5 parts by mass or more, still more preferably 2.5 parts by mass or more, while more preferably 10 parts by mass or less, still more preferably 7.5 parts by mass or less, relative to 100 parts by mass of the fluorine-containing copolymer.

Examples of the curing accelerator include organotin compounds, acidic phosphoric acid esters, reaction products of an acidic phosphoric acid ester and an amine, saturated or unsaturated polycarboxylic acids and acid anhydrides thereof, organotitanate compounds, amine compounds, lead octylate, and metal chelate compounds containing aluminum.

Examples of the metal chelate compounds include aluminum tris(acetylacetonate), aluminum ethylacetoacetate diisopropylate, aluminum tris(ethylacetoacetate), aluminum alkylacetoacetate diisopropylate, and aluminum bisethylacetoacetate monoacetylacetonate.

Specific examples of the organotin compounds include dibutyltin dilaurate, dibutyltin maleate, dioctyltin maleate, dibutyltin diacetate, dibutyltin phthalate, tin octylate, tin naphthenate, and dibutyltin methoxide.

The acidic phosphoric acid esters are phosphoric acid esters containing a moiety represented by the following formula.

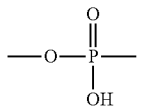

Examples thereof include organic acidic phosphoric acid esters represented by the following formula:

$(R^9-O)_b-P(=O)-(OH)_{3-b}$ wherein b is 1 or 2; and $R^9$ is an organic residue.

Specific examples thereof include those represented by the following formulas.

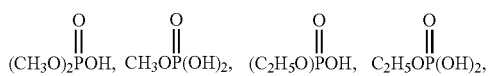

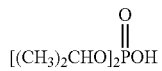

Examples of the organotitanate compounds include titanic acid esters such as tetrabutyl titanate, tetraisopropyl titanate, and triethanolamine titanate. Examples of commercially available products thereof include ORGATIX TC-100, TC-750, TC-760, and TA-30 (Matsumoto Fine Chemical Co., Ltd.).

Specific examples of the amine compounds include amine compounds such as butylamine, octylamine, dibutylamine, monoethanolamine, diethanolamine, triethanolamine, diethylenetriamine, triethylenetetramine, oleylamine, cyclohexylamine, benzylamine, diethylaminopropylamine, xylylenediamine, triethylenediamine, guanidine, diphenylguanidine, 2,4,6-tris(dimethylaminomethyl)phenol, morpholine, N-methylmorpholine, 1,8-diazabicyclo(5.4.0)undecene-7 (DBU), carboxylic acid salts thereof, low molecular weight polyamide resins obtainable from excessive amounts of a polyamine and a polybasic acid, and reaction products of excessive amounts of a polyamine and an epoxy compound.

The curing accelerators may be used alone or in combination of two or more thereof. The amount of the curing accelerator is preferably about $1.0\times10^{-6}$ to $1.0\times10^{-2}$ parts by mass, more preferably about $5.0\times10^{-5}$ to $1.0\times10^{-3}$ parts by mass, relative to 100 parts by mass of the fluorine-containing copolymer.

Specific examples of the pigment include, but are not limited to, inorganic pigments such as titanium dioxide, calcium carbonate, and carbon black; and organic pigments such as phthalocyanine pigments, quinacridone pigments, and azo pigments. The upper limit of the amount of the pigment is usually about 200 parts by mass relative to 100 parts by mass of the fluorine-containing copolymer.

Examples of the hydrophilic agent include methyl silicate, ethyl silicate, fluoroalkyl silicate, and condensation products thereof. Examples of commercially available products thereof include ET40 and ET48 (Colcoat Co., Ltd.), MS56, MS56S, and MS57 (Mitsubishi Chemical Corp.), and GH700 and GH701 (Daikin Industries, Ltd.).

Examples of the flatting agent include silica, silica alumina, alumina, talc, calcium carbonate, and titanium dioxide. The amount of the flatting agent is preferably 1 to 100 mass % relative to the fluorine-containing copolymer. Examples of commercially available products thereof include Sylysia 350, Sylysia 436, Sylysia 446, Sylophobic 100, and Sylophobic 200 (Fuji Silysia Chemical Ltd.), and SYLOID ED2, SYLOID ED30, and SYLOID ED50 (W.R. Grace).

Examples of the adhesiveness promoter include various polyol additives such as polyester polyols, polycarbonate polyols, polyether polyols, and polybutadiene polyols, and silane-coupling agents. The amount of the adhesiveness promoter is preferably 0.1 to 50 mass % relative to the fluorine-containing copolymer. Examples of commercially available products thereof include FLEXOREZ 148, FLEXOREZ 188, and FLEXOREZ A308 (Kusumoto Chemicals, Ltd.), ETERNACOLL UH-50 and ETERNACOLL UM-90 (Ube Industries, Ltd.), Adeka Polyether P-400 and Adeka Polyol BPX-21 (Adeka Corp.), NISSO-PB GI-1000, GI-2000, and GI-3000 (Nippon Soda Co., Ltd.).

The back sheet further includes the water-impermeable sheet. The water-impermeable sheet is a layer disposed so as to prevent permeation of moisture to the encapsulant and the solar cell, and may be formed from any material substantially preventing permeation of water. From the viewpoints of factors such as weight, price, and flexibility, polyethylene terephthalate (PET) sheets, $SiO_x$-deposited PET sheets, and metal thin sheets of aluminum or stainless steel are often used. In particular, very often used are PET sheets. The thickness thereof is usually about 50 to 250 μm. $SiO_x$-deposited PET sheets are often used for cases requiring especially moisture proofing. The thickness thereof is usually about 10 to 20 μm.

In order to improve the adhesiveness to the film, the water-impermeable sheet may be subjected to a conventionally known surface treatment. Examples of the surface treatment include corona discharge treatment, plasma discharge treatment, and passivation, and, for metal sheets, blast treatment.

The back sheet may be used in the state of adhering to an encapsulant layer of a solar cell module. For the back sheet including the film on one side of the water-impermeable sheet, the water-impermeable sheet and the encapsulant layer may be bonded to each other, or the film and the encapsulant layer may be bonded to each other. Preferably, the film and the encapsulant layer are bonded to each other because the film exhibits excellent adhesiveness to the water-impermeable sheet and excellent adhesiveness to the encapsulant layer. Also, preferably, the film is placed on the outermost surface of the solar cell module because the film has excellent weather resistance. Accordingly, the back sheet preferably includes the film on each side of the water-impermeable sheet.

The encapsulant layer is formed from an encapsulant and encapsulates the solar cell therein. Examples of the encapsulant include ethylene/vinyl acetate copolymers (EVA), polyvinyl butyral (PVB), silicone resin, epoxy resin, and acrylic resin. Preferred is EVA.

A solar cell module including the encapsulant layer and the back sheet is also one aspect of the invention.

Figure 2:
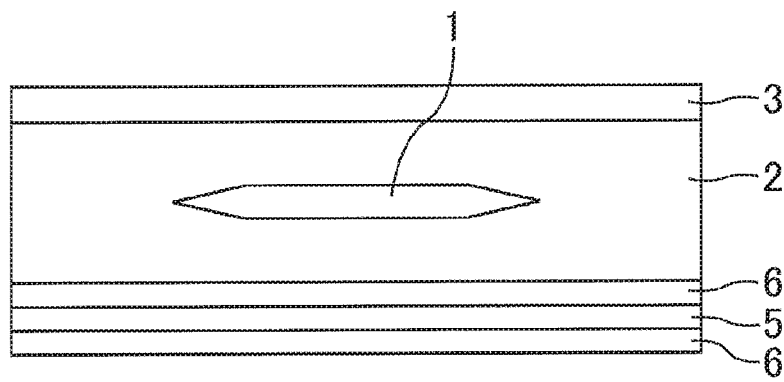
FIG. 2 is a schematic cross-sectional view of a second structure of a solar cell module.
Figure 3:
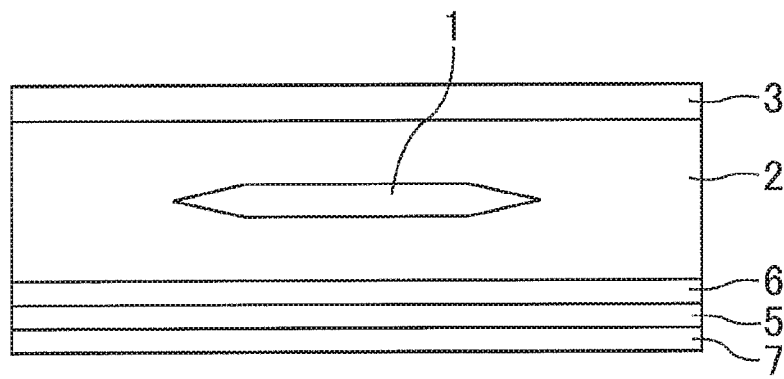
FIG. 3 is a schematic cross-sectional view of a third structure of a solar cell module.

Examples of a preferred structure of the solar cell module include those illustrated in FIGS. 1 to 3.

In a first structure illustrated in FIG. 1, a solar cell 1 is encapsulated in an encapsulant layer 2, and the encapsulant layer 2 is disposed between a surface layer 3 and a back sheet 4. The back sheet 4 includes a water-impermeable sheet 5 and a film 6. In this first structure, the film 6 is disposed only on the side of the encapsulant layer 2. In FIGS. 1 to 3, the film 6 is a film formed from the aforementioned coating containing a fluorine-containing copolymer.

The encapsulant layer 2 is formed from an ethylene/vinyl acetate copolymer (EVA), polyvinyl butyral (PVB), silicone resin, epoxy resin, or acrylic resin, for example.

The surface layer 3 is usually a glass plate, and may be a flexible material such as a resin sheet.

A second structure illustrated in FIG. 2 is a trilayer structure including the film 6 disposed on each side of the water-impermeable sheet 5.

Although the back sheet of this second structure has an increased thickness, this structure has both the adhesiveness owing to the film 6 on the side of the encapsulant layer 2 and the weather resistance owing to the film 6 on the side opposite to the encapsulant layer 2.

The back sheet having a trilayer structure may include a water-impermeable sheet, a film formed from the aforementioned coating containing a fluorine-containing copolymer on one side of the water-impermeable sheet, and a film formed from a fluorine-containing polymer coating free from a curable functional group, a fluorine-containing polymer sheet, a polyester sheet, or a film formed from a polyester coating (a different sheet or film) on the other side thereof.

A third structure illustrated in FIG. 3 is a structure including the film 6 formed from the aforementioned coating containing a fluorine-containing copolymer on the side of the encapsulant layer 2 of the water-impermeable sheet 5 and a different film 7 on the side opposite to the encapsulant layer 2.

The material of the film 7 may be a film formed from a fluorine-containing polymer coating free from a curable functional group, a fluorine-containing polymer sheet, a polyester sheet, or a film formed from a polyester coating.

In order to further improve the adhesiveness between the film and the encapsulant layer, the film may be subjected to a conventionally known surface treatment. Examples of the surface treatment include corona discharge treatment, plasma discharge treatment, passivation, and blast treatment.

Examples of the film formed from a fluorine-containing polymer coating free from a curable functional group include a film formed from a coating containing polyvinylidene fluoride (PVdF) mixed with a tetraalkoxysilane or a partially hydrolyzed product thereof disclosed in JP 2004-214342 A, a film formed from a coating mixture of a VdF/TFE/CTFE copolymer and an alkoxysilane unit-containing acrylic resin, a film formed from a coating mixture of a VdF/TFE/HFP copolymer and a hydroxy-containing acrylic resin, and a film formed from a coating containing a VdF/HFP copolymer mixed with an aminosilane-coupling agent. In order to achieve good opacity, weather resistance, chemical resistance, and moisture resistance, the film preferably usually has a thickness of 5 to 300 μm. The thickness is more preferably 10 to 100 μm, still more preferably 10 to 50 μm. Also, in this case, a different layer such as a primer layer may be disposed.

Examples of the fluorine-containing polymer sheet include fluorine-containing polymer sheets used in current back sheets, such as PVdF sheets, polyvinyl fluoride (PVF) sheets, PCTFE sheets, TFE/HFP/ethylene copolymer sheets, TFE/HFP copolymer (FEP) sheets, TFE/perfluoro(alkyl vinyl ether) (PAVE) copolymer (PFA) sheets, ethylene/TFE copolymer (ETFE) sheets, and ethylene/CTFE copolymer (ECTFE) sheets. In order to achieve good weather resistance, the thickness is preferably usually 5 to 300 μm. The thickness is more preferably 10 to 100 μm, still more preferably 10 to 50 μm.

The polyester sheet may be one as it is used in conventional back sheets, and can be bonded to the water-impermeable sheet 5 using an acrylic adhesive, urethane adhesive, epoxy adhesive, or polyester adhesive, for example. In order to achieve good weather resistance, low cost, and good transparency, the polyester sheet preferably usually has a thickness of 5 to 300 μm. The thickness is more preferably 10 to 100 μm, still more preferably 10 to 50 μm.

Examples of the polyester coating include those containing a saturated polyester resin formed from a polycarboxylic acid and a polyhydric alcohol, and those containing an unsaturated polyester resin formed from a maleic or fumaric anhydride and a glycol. The polyester coating can form a film by, for example, roll coating, curtain coating, spray coating, die coating, or other coating technique. In order to achieve good opacity, weather resistance, chemical resistance, and moisture resistance, the film preferably has a thickness of 5 to 300 μm. The thickness is more preferably 10 to 100 μm, still more preferably 10 to 50 μm. Also, in this case, a different layer such as a primer layer may be disposed.

EXAMPLES

The invention is described hereinbelow referring to, but not limited to, examples.

The parameters in the examples were determined by the following methods.

The PET adhesiveness and the EVA adhesiveness were determined before and after corona discharge treatment on the surface of the film of the back sheet. The PET adhesiveness herein means the adhesiveness between the film and the water-impermeable sheet (hereinafter, also referred to simply as "PET") formed from polyethylene terephthalate (PET) in the back sheet. The EVA adhesiveness herein means the adhesiveness between the film of the back sheet and an EVA resin sheet (hereinafter, also referred to simply as "EVA").

A measurement sample was produced by the following procedure. An EVA resin sheet (SOLAR EVA, Mitsui Chemicals Fabro, Inc., thickness: 600 µm) was placed on the film of the back sheet, and a glass (thickness: 3.2 mm) was placed on the EVA resin sheet. The layers were compression-bonded to each other at a pressure of 100 g/cm$^2$ and a temperature of 150° C. Thereby, a trilayer (glass/EVA/back sheet) measurement sample before corona discharge treatment on the film surface was produced.

The surface of the film of the back sheet was subjected to corona discharge treatment, and then an EVA resin sheet (SOLAR EVA, Mitsui Chemicals Fabro, Inc., thickness: 600 µm) was placed on the film and a glass (thickness: 3.2 mm) was placed on the EVA resin sheet. The layers were compression-bonded to each other at a pressure of 100 g/cm$^2$ and a temperature of 150° C. Thereby, a trilayer (glass/EVA/back sheet) measurement sample after corona discharge treatment on the film surface was produced.

(Before Corona Discharge Treatment on Film Surface)

EVA adhesiveness: The adhesiveness was determined by a peeling test.

The EVA/back sheet portion of the measurement sample before corona discharge treatment on the film surface was provided with a cut with a size of 1 cm in width×15 cm in length. The sample was then subjected to a 180-degree peeling test using TENSILON (Orientec Co., Ltd.). Thereby, the bond strength between the EVA resin sheet and the film was measured in terms of N/cm.

(After Corona Discharge Treatment on Film Surface)

PET adhesiveness and EVA adhesiveness: The adhesivenesses were determined by a peeling test.

The EVA/back sheet portion of the measurement sample after corona discharge treatment on the film surface was provided with a cut with a size of 1 cm in width×15 cm in length. The sample was then subjected to a 180-degree peeling test using TENSILON (Orientec Co., Ltd.). Thereby, the bond strength between EVA/film was measured in terms of N/cm.

One object of this peeling test is to measure the peel strength between the EVA and the back sheet. In some of the measurement samples, the film of the back sheet was broken during the peeling test, and thereafter the peeling between the film and PET of the back sheet progressed. Thus, the peeling test was performed 10 times and the number of peelings between the film and the PET was counted. The cases where the films were not broken in all of the 10 peeling tests were evaluated that the number of peelings was 0. Further, samples with the film being broken were subjected to measurement of the bond strength between the film and the PET in terms of N/cm in addition to the peel strength between the EVA and the back sheet.

Example 1

Under stirring, 259 parts by mass of a butyl acetate solution containing 50.7 mass % of a fluorine-containing copolymer having a composition shown in Table 1, 263 parts by mass of titanium oxide (D918, Sakai Chemical Industry Co., Ltd.) serving as white pigment, and 115 parts by mass of butyl acetate were premixed, and then 632 parts by mass of 1.2-mm-diameter glass beads were added thereto. These components were dispersed using a pigment disperser at 1500 rpm for one hour. Thereafter, the glass beads were filtered out using a #80-mesh sieve. To the resulting solution was further added 363 parts by mass of the butyl acetate solution containing a fluorine-containing copolymer. Thereby, a composition was prepared.

To a 100 parts by mass portion of this composition was added 54 parts by mass of a curing agent (Sumidur N3300, Sumika Byer, NCO content: 21.8%), and thereby a coating was prepared.

A PET film (Lumirror S10, Toray Industries, Inc., thickness: 250 µm) was used as a water-impermeable sheet, and the coating was applied to one side of the PET film using a coater such that the dry thickness of the coating was 20 µm. Then, the coating was dried at 130° C. for five minutes, and thereby a back sheet having a bilayer structure was produced. For this back sheet, the PET adhesiveness and the EVA adhesiveness were determined.

Example 2

Under stirring, 259 parts by mass of a butyl acetate solution containing 50.7 mass % of a fluorine-containing copolymer having a composition shown in Table 1, 263 parts by mass of titanium oxide (D918, Sakai Chemical Industry Co., Ltd.) serving as white pigment, and 115 parts by mass of butyl acetate were premixed, and then 632 parts by mass of 1.2-mm-diameter glass beads were added thereto. These components were dispersed using a pigment disperser at 1500 rpm for one hour. Thereafter, the glass beads were filtered out using a #80-mesh sieve. To the resulting solution was further added 363 parts by mass of the butyl acetate solution containing a fluorine-containing copolymer. Thereby, a composition was prepared.

To a 100 parts by mass portion of this composition was added 48 parts by mass of a curing agent (Sumidur N3300, Sumika Byer, NCO content: 21.8%), and thereby a coating was prepared.

A PET film (Lumirror S10, Toray Industries, Inc., thickness: 250 µm) was used as a water-impermeable sheet, and the coating was applied to one side of the PET film using a coater such that the dry thickness of the coating was 20 µm. Then, the coating was dried at 130° C. for five minutes, and thereby a back sheet having a bilayer structure was produced. For this back sheet, the PET adhesiveness and the EVA adhesiveness were determined.

Example 3

Under stirring, 259 parts by mass of a butyl acetate solution containing 50.7 mass % of a fluorine-containing copolymer having a composition shown in Table 1, 263 parts by mass of titanium oxide (D918, Sakai Chemical Industry Co., Ltd.) serving as white pigment, and 115 parts by mass of butyl acetate were premixed, and then 632 parts by mass of 1.2-mm-diameter glass beads were added thereto. These components were dispersed using a pigment disperser at 1500 rpm for one hour. Thereafter, the glass beads were filtered out using a #80-mesh sieve. To the resulting solution was further added 363 parts by mass of the butyl acetate solution containing a fluorine-containing copolymer. Thereby, a composition was prepared.

To a 100 parts by mass portion of this composition was added 57 parts by mass of a curing agent (Sumidur N3300, Sumika Byer, NCO content: 21.8%), and thereby a coating was prepared.

A PET film (Lumirror S10, Toray Industries, Inc., thickness: 250 μm) was used as a water-impermeable sheet, and the coating was applied to one side of the PET film using a coater such that the dry thickness of the coating was 20 μm. Then, the coating was dried at 130° C. for five minutes, and thereby a back sheet having a bilayer structure was produced. For this back sheet, the PET adhesiveness and the EVA adhesiveness were determined.

Example 4

Under stirring, 259 parts by mass of a butyl acetate solution containing 50.7 mass % of a fluorine-containing copolymer having a composition shown in Table 1, 263 parts by mass of titanium oxide (D918, Sakai Chemical Industry Co., Ltd.) serving as white pigment, and 115 parts by mass of butyl acetate were premixed, and then 632 parts by mass of 1.2-mm-diameter glass beads were added thereto. These components were dispersed using a pigment disperser at 1500 rpm for one hour. Thereafter, the glass beads were filtered out using a #80-mesh sieve. To the resulting solution was further added 363 parts by mass of the butyl acetate solution containing a fluorine-containing copolymer. Thereby, a composition was prepared.

To a 100 parts by mass portion of this composition was added 54 parts by mass of a curing agent (Sumidur N3300, Sumika Byer, NCO content: 21.8%), and thereby a coating was prepared.

A PET film (Lumirror S10, Toray Industries, Inc., thickness: 250 μm) was used as a water-impermeable sheet, and the coating was applied to one side of the PET film using a coater such that the dry thickness of the coating was 20 μm. Then, the coating was dried at 130° C. for five minutes, and thereby a back sheet having a bilayer structure was produced. For this back sheet, the PET adhesiveness and the EVA adhesiveness were determined.

Example 5

Under stirring, 259 parts by mass of a butyl acetate solution containing 50.7 mass % of a fluorine-containing copolymer having a composition shown in Table 1, 263 parts by mass of titanium oxide (D918, Sakai Chemical Industry Co., Ltd.) serving as white pigment, and 115 parts by mass of butyl acetate were premixed, and then 632 parts by mass of 1.2-mm-diameter glass beads were added thereto. These components were dispersed using a pigment disperser at 1500 rpm for one hour. Thereafter, the glass beads were filtered out using a #80-mesh sieve. To the resulting solution was further added 363 parts by mass of the butyl acetate solution containing a fluorine-containing copolymer. Thereby, a composition was prepared.

To a 100 parts by mass portion of this composition was added 61 parts by mass of a curing agent (Sumidur N3300, Sumika Byer, NCO content: 21.8%), and thereby a coating was prepared.

A PET film (Lumirror S10, Toray Industries, Inc., thickness: 250 μm) was used as a water-impermeable sheet, and the coating was applied to one side of the PET film using a coater such that the dry thickness of the coating was 20 μm. Then, the coating was dried at 130° C. for five minutes, and thereby a back sheet having a bilayer structure was produced. For this back sheet, the PET adhesiveness and the EVA adhesiveness were determined.

Example 6

Under stirring, 259 parts by mass of a butyl acetate solution containing 50.7 mass % of a fluorine-containing copolymer having a composition shown in Table 1, 263 parts by mass of titanium oxide (D918, Sakai Chemical Industry Co., Ltd.) serving as white pigment, and 115 parts by mass of butyl acetate were premixed, and then 632 parts by mass of 1.2-mm-diameter glass beads were added thereto. These components were dispersed using a pigment disperser at 1500 rpm for one hour. Thereafter, the glass beads were filtered out using a #80-mesh sieve. To the resulting solution was further added 363 parts by mass of the butyl acetate solution containing a fluorine-containing copolymer. Thereby, a composition was prepared.

To a 100 parts by mass portion of this composition was added 61 parts by mass of a curing agent (Sumidur N3300, Sumika Byer, NCO content: 21.8%), and thereby a coating was prepared.

A PET film (Lumirror S10, Toray Industries, Inc., thickness: 250 μm) was used as a water-impermeable sheet, and the coating was applied to one side of the PET film using a coater such that the dry thickness of the coating was 20 μm. Then, the coating was dried at 130° C. for five minutes, and thereby a back sheet having a bilayer structure was produced. For this back sheet, the PET adhesiveness and the EVA adhesiveness were determined.

Example 7

Under stirring, 259 parts by mass of a butyl acetate solution containing 50.7 mass % of a fluorine-containing copolymer having a composition shown in Table 1, 263 parts by mass of titanium oxide (D918, Sakai Chemical Industry Co., Ltd.) serving as white pigment, and 115 parts by mass of butyl acetate were premixed, and then 632 parts by mass of 1.2-mm-diameter glass beads were added thereto. These components were dispersed using a pigment disperser at 1500 rpm for one hour. Thereafter, the glass beads were filtered out using a #80-mesh sieve. To the resulting solution was further added 363 parts by mass of the butyl acetate solution containing a fluorine-containing copolymer. Thereby, a composition was prepared.

To a 100 parts by mass portion of this composition was added 98 parts by mass of a curing agent (Sumidur N3300, Sumika Byer, NCO content: 21.8%), and thereby a coating was prepared.

A PET film (Lumirror S10, Toray Industries, Inc., thickness: 250 μm) was used as a water-impermeable sheet, and the coating was applied to one side of the PET film using a coater such that the dry thickness of the coating was 20 μm. Then, the coating was dried at 130° C. for five minutes, and thereby a back sheet having a bilayer structure was produced. For this back sheet, the PET adhesiveness and the EVA adhesiveness were determined.

Example 8

Under stirring, 259 parts by mass of a butyl acetate solution containing 50.7 mass % of a fluorine-containing copolymer having a composition shown in Table 1, 263 parts by mass of titanium oxide (D918, Sakai Chemical Industry Co., Ltd.) serving as white pigment, and 115 parts by mass of butyl acetate were premixed, and then 632 parts by mass of 1.2-mm-diameter glass beads were added thereto. These components were dispersed using a pigment disperser at 1500 rpm for one hour. Thereafter, the glass beads were filtered out using a #80-mesh sieve. To the resulting solution was further added 363 parts by mass of the butyl acetate solution containing a fluorine-containing copolymer. Thereby, a composition was prepared.

To a 100 parts by mass portion of this composition was added 55 parts by mass of a curing agent (Sumidur N3300, Sumika Byer, NCO content: 21.8%), and thereby a coating was prepared.

A PET film (Lumirror S10, Toray Industries, Inc., thickness: 250 μm) was used as a water-impermeable sheet, and the coating was applied to one side of the PET film using a coater such that the dry thickness of the coating was 20 μm. Then, the coating was dried at 130° C. for five minutes, and thereby a back sheet having a bilayer structure was produced. For this back sheet, the PET adhesiveness and the EVA adhesiveness were determined.

Example 9

Under stirring, 259 parts by mass of a butyl acetate solution containing 50.7 mass % of a fluorine-containing copolymer having a composition shown in Table 1, 263 parts by mass of titanium oxide (D918, Sakai Chemical Industry Co., Ltd.) serving as white pigment, and 115 parts by mass of butyl acetate were premixed, and then 632 parts by mass of 1.2-mm-diameter glass beads were added thereto. These components were dispersed using a pigment disperser at 1500 rpm for one hour. Thereafter, the glass beads were filtered out using a #80-mesh sieve. To the resulting solution was further added 363 parts by mass of the butyl acetate solution containing a fluorine-containing copolymer. Thereby, a composition was prepared.

To a 100 parts by mass portion of this composition was added 58 parts by mass of a curing agent (Sumidur N3300, Sumika Byer, NCO content: 21.8%), and thereby a coating was prepared.

A PET film (Lumirror S10, Toray Industries, Inc., thickness: 250 μm) was used as a water-impermeable sheet, and the coating was applied to one side of the PET film using a coater such that the dry thickness of the coating was 20 μm. Then, the coating was dried at 130° C. for five minutes, and thereby a back sheet having a bilayer structure was produced. For this back sheet, the PET adhesiveness and the EVA adhesiveness were determined.

Comparative Example 1

Under stirring, 202 parts by mass of a butyl acetate solution containing 65 mass % of a fluorine-containing copolymer having a composition shown in Table 1, 263 parts by mass of titanium oxide (D918, Sakai Chemical Industry Co., Ltd.) serving as white pigment, and 167 parts by mass of butyl acetate were premixed, and then 632 parts by mass of 1.2-mm-diameter glass beads were added thereto. These components were dispersed using a pigment disperser at 1500 rpm for one hour. Thereafter, the glass beads were filtered out using a #80-mesh sieve. To the resulting solution were further added 283 parts by mass of the butyl acetate solution containing a fluorine-containing copolymer and 85 parts by mass of butyl acetate. Thereby, a composition was prepared.

To a 100 parts by mass portion of this composition was added 69 parts by mass of a curing agent (Sumidur N3300, Sumika Byer, NCO content: 21.8%), and thereby a coating was prepared.

A PET film (Lumirror S10, Toray Industries, Inc., thickness: 250 μm) was used as a water-impermeable sheet, and the coating was applied to one side of the PET film using a coater such that the dry thickness of the coating was 20 μm. Then, the coating was dried at 130° C. for five minutes, and thereby a back sheet having a bilayer structure was produced. For this back sheet, the PET adhesiveness and the EVA adhesiveness were determined.

Comparative Example 2

Under stirring, 202 parts by mass of a butyl acetate solution containing 65 mass % of a fluorine-containing copolymer having a composition shown in Table 1, 263 parts by mass of titanium oxide (D918, Sakai Chemical Industry Co., Ltd.) serving as white pigment, and 167 parts by mass of butyl acetate were premixed, and then 632 parts by mass of 1.2-mm-diameter glass beads were added thereto. These components were dispersed using a pigment disperser at 1500 rpm for one hour. Thereafter, the glass beads were filtered out using a #80-mesh sieve. To the resulting solution were further added 283 parts by mass of the butyl acetate solution containing a fluorine-containing copolymer and 85 parts by mass of butyl acetate. Thereby, a composition was prepared.

To a 100 parts by mass portion of this composition was added 77 parts by mass of a curing agent (Sumidur N3300, Sumika Byer, NCO content: 21.8%), and thereby a coating was prepared.

A PET film (Lumirror S10, Toray Industries, Inc., thickness: 250 μm) was used as a water-impermeable sheet, and the coating was applied to one side of the PET film using a coater such that the dry thickness of the coating was 20 μm. Then, the coating was dried at 130° C. for five minutes, and thereby a back sheet having a bilayer structure was produced. For this back sheet, the PET adhesiveness and the EVA adhesiveness were determined.

Comparative Example 3

Under stirring, 202 parts by mass of a butyl acetate solution containing 65 mass % of a fluorine-containing copolymer having a composition shown in Table 1, 263 parts by mass of titanium oxide (D918, Sakai Chemical Industry Co., Ltd.) serving as white pigment, and 167 parts by mass of butyl acetate were premixed, and then 632 parts by mass of 1.2-mm-diameter glass beads were added thereto. These components were dispersed using a pigment disperser at 1500 rpm for one hour. Thereafter, the glass beads were filtered out using a #80-mesh sieve. To the resulting solution were further added 283 parts by mass of the butyl acetate solution containing a fluorine-containing copolymer and 85 parts by mass of butyl acetate. Thereby, a composition was prepared.

To a 100 parts by mass portion of this composition was added 63 parts by mass of a curing agent (Sumidur N3300, Sumika Byer, NCO content: 21.8%), and thereby a coating was prepared.

A PET film (Lumirror S10, Toray Industries, Inc., thickness: 250 μm) was used as a water-impermeable sheet, and the coating was applied to one side of the PET film using a coater such that the dry thickness of the coating was 20 μm. Then, the coating was dried at 130° C. for five minutes, and thereby a back sheet having a bilayer structure was produced. For this back sheet, the PET adhesiveness and the EVA adhesiveness were determined.

Comparative Example 4

Under stirring, 259 parts by mass of a butyl acetate solution containing 50.7 mass % of a fluorine-containing copolymer having a composition shown in Table 1, 263 parts by mass of titanium oxide (D918, Sakai Chemical Industry Co., Ltd.) serving as white pigment, and 115 parts by mass of butyl acetate were premixed, and then 632 parts by mass of 1.2-mm-diameter glass beads were added thereto. These components were dispersed using a pigment disperser at 1500 rpm for one hour. Thereafter, the glass beads were filtered out using a #80-mesh sieve. To the resulting solution was further added 363 parts by mass of the butyl acetate solution containing a fluorine-containing copolymer. Thereby, a composition was prepared.

To a 100 parts by mass portion of this composition was added 81 parts by mass of a curing agent (Sumidur N3300, Sumika Byer, NCO content: 21.8%), and thereby a coating was prepared.

A PET film (Lumirror S10, Toray Industries, Inc., thickness: 250 μm) was used as a water-impermeable sheet, and the coating was applied to one side of the PET film using a coater such that the dry thickness of the coating was 20 μm. Then, the coating was dried at 130° C. for five minutes, and thereby a back sheet having a bilayer structure was produced. For this back sheet, the PET adhesiveness and the EVA adhesiveness were determined.

TABLE 1

|  |  |  | Example 1 | Example 2 | Example 3 | Example 4 | Example 5 | Example 6 | Example 7 | Example 8 |
|---|---|---|---|---|---|---|---|---|---|---|
| Composition of fluorine-containing copolymer (mol %) | (a) | Tetrafluoroethylene | 48.1 | 45.9 | 46.3 | 25.7 | 25.3 | 24.8 | 46.0 | 45.0 |
|  |  | Chlorotrifluoroethylene |  |  |  |  |  |  |  |  |
|  | (b) | Vinyl acetate | 34.5 | 30.8 | 32.0 | 63.8 | 84.2 | 64.7 | 30.5 | 45.5 |
|  | (c) | Hydroxybutyl vinyl ether |  | 9.3 | 8.8 | 10.0 | 10.0 | 10.0 | 16.0 | 9.0 |
|  |  | Hydroxyethyl vinyl ether | 7.9 |  |  |  |  |  |  |  |
|  | (d) | Acrylic acid | 0.5 |  | 0.7 |  |  |  | 0.5 |  |
|  |  | Undecylenic acid |  | 1.2 |  | 0.5 | 0.5 | 0.5 |  | 0.5 |
|  | (e) | VeoVa 9 |  |  |  |  |  |  |  |  |
|  |  | VeoVa 10 | 11.0 | 12.8 | 12.2 |  |  |  |  |  |
|  |  | Vinyl benzoate |  |  |  |  |  |  | 8.0 |  |
| Number average molecular weight of fluorine-containing copolymer |  |  | 18000 | 19000 | 19000 | 9300 | 10400 | 18000 | 18000 | 19000 |
| Before corona discharge treatment on film surface | EVA adhesiveness (N/cm) |  | 31 | 32 | 30 | 28 | 27 | 25 | 22 | 27 |
| After corona discharge treatment on film surface | EVA adhesiveness (N/cm) |  | 61 | 60 | 60 | 55 | 53 | 50 | 41 | 53 |
|  | Number of peeling between film and PET (times/10 times) |  | 0 | 0 | 0 | 2 | 3 | 1 | 4 | 1 |
|  | Bond strength between film and PET (N/cm) |  | — | — | — | 11 | 11 | 13 | 9 | 14 |

|  |  |  | Example 9 | Comparative Example 1 | Comparative Example 2 | Comparative Example 3 | Comparative Example 4 |
|---|---|---|---|---|---|---|---|
| Composition of fluorine-containing copolymer (mol %) | (a) | Tetrafluoroethylene |  | 45.0 | 44.0 | 44.0 | 46.0 |
|  |  | Chlorotrifluoroethylene | 45.0 |  |  |  |  |
|  | (b) | Vinyl acetate | 45.0 |  |  |  | 36.0 |
|  | (c) | Hydroxybutyl vinyl ether | 9.4 | 15.3 |  | 14.0 | 18.0 |
|  |  | Hydroxyethyl vinyl ether |  |  | 17.0 |  |  |
|  | (d) | Acrylic acid |  | 0.9 | 0.8 |  |  |
|  |  | Undecylenic acid | 0.6 |  |  |  |  |
|  | (e) | VeoVa 9 |  | 20.1 |  |  |  |
|  |  | VeoVa 10 |  | 13.3 | 38.2 | 42.0 |  |
|  |  | Vinyl benzoate |  | 6.5 |  |  |  |
| Number average molecular weight of fluorine-containing copolymer |  |  | 17000 | 13000 | 13000 | 12000 | 13000 |
| Before corona discharge treatment on film surface | EVA adhesiveness (N/cm) |  | 24 | 5 | 4 | 4 | 19 |
| After corona discharge treatment on film surface | EVA adhesiveness (N/cm) |  | 39 | 45 | 40 | 36 | 36 |
|  | Number of peeling between film and PET (times/10 times) |  | 1 | 8 | 9 | 9 | 6 |
|  | Bond strength between film and PET (N/cm) |  | 15 | 2 | 2 | 2 | 3 |

In the table, VeoVa 9 means vinyl versatate (trade name of C9 aliphatic vinyl carboxylate available from Shell Chemicals) and VeoVa 10 means vinyl versatate (trade name of C10 aliphatic vinyl carboxylate available from Shell Chemicals).

REFERENCE SIGNS LIST

1: Solar cell
2: Encapsulant layer
3: Surface layer
4: Back sheet
5: Water-impermeable sheet
6: Film formed from coating containing fluorine-containing copolymer
7: Different film

The invention claimed is:

1. A back sheet for a solar cell module, comprising:
a water-impermeable sheet; and
a film,
the film being disposed on at least one side of the water-impermeable sheet and being formed from a coating containing a fluorine-containing copolymer,
the fluorine-containing copolymer containing:
(a) a C2-C3 perhaloolefin structural unit;
(b) a vinyl acetate structural unit;
(c) a hydroxy-containing vinyl monomer structural unit represented by the formula (1):

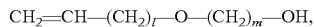

wherein l is 0 or 1, and m is an integer of 2 or greater; and
(d) a carboxy-containing monomer structural unit represented by the formula (2):

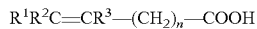

wherein $R^1$, $R^2$, and $R^3$ are the same as or different from each other, and are each a hydrogen atom or a C1-C10 linear or branched alkyl group, and n is 0 or 1.

2. The back sheet according to claim 1,
wherein in the formula (1), l is 0 and m is 2 or 4.
3. The back sheet according to claim 1,
wherein the fluorine-containing copolymer contains:
15 to 50 mol % of the structural unit (a);
20 to 75 mol % of the structural unit (b);
5 to 22 mol % of the structural unit (c); and
0.1 to 5 mol % of the structural unit (d).
4. The back sheet according to claim 1,
wherein the fluorine-containing copolymer further contains, as a monomer structural unit (e), a non-aromatic vinyl ester structural unit other than the vinyl acetate structural unit.
5. The back sheet according to claim 1,
wherein the fluorine-containing copolymer has a number average molecular weight of 3,000 to 100,000.
6. The back sheet according to claim 1,
wherein the proportion of the structural unit (a) to the sum of the moles of the structural unit (a) and the structural unit (b) is 0.16 to 0.51 in the fluorine-containing copolymer.
7. The back sheet according to claim 1,
wherein the coating further contains an organic solvent.
8. The back sheet according to claim 1,
wherein the coating further contains a curing agent.
9. A solar cell module comprising:
a solar cell;
an encapsulant layer that encapsulates the solar cell therein; and
the back sheet according to claim 1.
10. The back sheet according to claim 1, wherein in formula (2), n is 0.

* * * * *